(12) United States Patent
Bae

(10) Patent No.: US 6,897,136 B2
(45) Date of Patent: May 24, 2005

(54) METHOD FOR FORMING FUSE IN SEMICONDUCTOR DEVICE

(75) Inventor: Se Yeul Bae, Kyoungki-do (KR)

(73) Assignee: Dongbu Electronics Co., Ltd., Seoul (KR)

(*) Notice: Subject to any disclaimer, the term of this patent is extended or adjusted under 35 U.S.C. 154(b) by 0 days.

(21) Appl. No.: 10/329,097

(22) Filed: Dec. 23, 2002

(65) Prior Publication Data

US 2003/0119293 A1 Jun. 26, 2003

(30) Foreign Application Priority Data

Dec. 26, 2001 (KR) .............................. 10-2001-0085201

(51) Int. Cl.[7] .......................... H01L 21/44; H01L 21/82
(52) U.S. Cl. ........................................ 438/601; 438/132
(58) Field of Search .......................... 438/132, 333, 438/601

(56) References Cited

U.S. PATENT DOCUMENTS

| | | | |
|---|---|---|---|
| 5,565,374 A | * 10/1996 | Fukusho | 438/60 |
| 6,180,503 B1 | * 1/2001 | Tzeng et al. | 438/601 |
| 6,184,121 B1 | * 2/2001 | Buchwalter et al. | 438/622 |
| 6,249,038 B1 | 6/2001 | Daubenspeck et al. | |
| 6,261,873 B1 | 7/2001 | Bouldin et al. | |

* cited by examiner

Primary Examiner—Amir Zarabian
Assistant Examiner—Pamela E Perkins
(74) Attorney, Agent, or Firm—Timothy J. Keefer; Seyfarth Shaw LLP

(57) ABSTRACT

A method for forming a fuse in a semiconductor device comprising: forming a second insulating layer on a first insulating layer; etching the second insulating layer to form a trench; depositing a first metal layer on the trench and the second insulating layer; performing a chemical-mechanical polishing (CMP) process on the first metal layer to form the first metal wiring; forming a third insulating layer on the first metal wiring and the second insulating layer; etching the third insulating layer to form a second trench; depositing a barrier layer and a second metal layer on the second trench and the third insulating layer, and performing a CMP process on the barrier layer and the third insulating layer to form the second metal wiring; depositing a buffer layer on the second metal wiring and the third insulating layer; forming a passivation layer on the buffer layer; and etching the passivation layer.

8 Claims, 4 Drawing Sheets

METHOD FOR FORMING FUSE IN SEMICONDUCTOR DEVICE

BACKGROUND OF THE INVENTION

1. Field of the Invention

The present invention relates to a method for forming a fuse in a semiconductor device, and more particularly to a method for forming a fuse in a semiconductor device, which can prevent corrosion produced during a formation of the fuse in metal wiring, by using patterns obtained through a damascene process.

2. Description of the Prior Art

As generally known in the art, aluminium (Al), which is used as a material for metal wiring, has a specific resistance of 2.7 $\mu\Omega$cm, which is the fourth lowest specific resistance of all existing metals, and a good electric conductivity, resulting in its application in the production of semiconductor devices. However, aluminium is known to be poor in resistance against an electro-migration (EM), which produces voids and hillocks originating from mass transport.

Copper (Cu) has become a substitute material for wiring materials in the next generation, as it has a specific resistance of 1.7 $\mu\Omega$cm and a good resistance against electro-migration, as compared with aluminium.

The dual damascene pattern production method that defines a contact hole and a wiring region, as employed generally, utilizing copper as a wiring material.

The dual damascene pattern production process includes the step sequences of carrying out lithography, etching and striping, trench lithography, trench etching and striping or trench lithography, trench etching and striping, lithography, etching and striping.

FIGS. 1A and 1B are sectional views illustrating each step of a conventional method for forming a fuse in a semiconductor device.

Referring to FIG. 1A, the left drawing is a layout 2 for forming metal wiring in a fuse box, and the right drawing is a sectional view taken along line A–B in the left drawing showing the metal wiring in the fuse box fabricated by using the left drawing as a mask.

To explain specifically, a metal wiring process is carried out in the lower part of the device and then an insulating layer 1 is sprayed on the metal wiring, and a trench for metal wiring is formed using a mask drawn like the fuse layout 2 for the metal wiring.

Further, a metal wiring barrier layer 3 is sprayed on the trench, and metal wiring materials are sprayed thickly and performing a chemical-mechanical polishing (CMP) process to result in the formation of metal wiring 4 in the region that will be used for a fuse.

Referring to FIG. 1B, the left drawing is a layout 6 of the fuse box shown in FIG. 1A, and the right drawing is a sectional view taken along line A–B showing the fuse box with an opening fabricated by using the left drawing of FIG. 1B as a mask.

To explain specifically, a passivation layer 5 is sprayed on the resultant structure including the metal wiring and the insulating layer 1, and then etching of the passivation layer 5 and the metal wiring 4 is performed using a drawn mask like the layout 6 of the fuse open box to expose the metal wiring barrier layer 3 that will be used as a fuse.

However, regarding the conventional method for forming a fuse in a semiconductor device, when using copper as the metal wiring, there is a probability that copper is corroded while being etched, exposing the fuse box. Further, it is difficult to perform etching of an oxide layer and copper at the same time. In practice, it has been considerably difficult to leave just the metal wiring barrier layer that would be used as a fuse layer.

Further, the corrosion of copper originating from the exposure of the fuse reduces the reliability of the semiconductor device considerably, and as there is no oxide layer left on the metal wiring barrier layer, it is considerably difficult to cut the fuse with a laser cutting method, which is a general cutting method employed to cut the fuse. This is because when the laser cutting is performed, it is known that it is necessary to leave an oxide layer of a certain thickness on the layer that will be used as a fuse.

SUMMARY OF THE INVENTION

Accordingly, the present invention has been made to solve the above-mentioned problems occurring in the prior art, and an object of the present invention is to provide a method for forming a fuse in a semiconductor device, which can prevent corrosion of the fuse originating during the formation of the fuse in the metal wiring, by using a pattern made through a damascene process.

Another object of the present invention is to provide a method for forming a fuse in a semiconductor device, which can form a fuse in a process of multi-layer metal wiring.

In order to accomplish these objects, a method for forming a fuse in a semiconductor device is disclosed, which method comprises the steps of: forming a second insulating layer on a first insulating layer; etching the second insulating layer by using a first mask pattern, thus form a trench for a first metal wiring; depositing a first metal layer on the trench for the first metal wiring and the second insulating layer; performing a chemical-mechanical polishing process of the first metal layer, thus forming the first metal wiring in a region that is to be used as a fuse; forming a third insulating layer on the first metal wiring and the second insulating layer; etching the third insulating layer by using a second mask pattern, thus forming a trench for a second metal wiring in a region that is to be connected with a lower layer by means of a contact; depositing a barrier layer and a second metal layer on the trench for the second metal wiring and the third insulating layer; performing a CMP process of the barrier layer and the third insulating layer, thus forming the second metal wiring in a region that is to be connected with a lower layer by means of a contact; depositing a buffer layer on the second metal wiring and the third insulating layer, the buffer layer being intended to act as an etch buffer layer at the time of etching in order to open a fuse box; and forming a passivation layer on the buffer layer; and etching the passivation layer to a desired thickness by using a third mask pattern.

In this embodiment of the present invention, the first metal layer can be made of Ti or Ti/TiN, and the second metal layer can be made of aluminium (Al) or copper (Cu).

Also, the first metal wiring is only formed in a region intended to be used as a fuse.

Further, the second metal wiring is only formed in a region intended to be connected with a lower layer by means of a contact, without forming metal wiring intended to be used as a fuse.

Additionally, the first mask pattern and the second mask pattern are overlapped to a certain width, and the third mask pattern is positioned at a desired interval apart from the second mask pattern in consideration of misalignment of the masks in the masking process.

Also, the etching of the passivation layer is performed so that the first metal wiring is not exposed, and the buffer layer is made of nitride.

In accordance with another aspect of the present invention, there is provided a method for forming a fuse in a semiconductor device, comprising the steps of: forming a first insulating layer; etching the first insulating layer by using a first mask pattern, thus forming a trench for a first metal wiring; depositing a barrier layer and the first metal layer on the trench and the first insulating layer; performing a CMP process of the barrier layer and the first metal layer, thus forming a first metal wiring in a region intended to be used as a fuse; forming a second insulating layer on the first metal wiring and the first insulating layer; etching the second insulating layer by using a second mask pattern, thus forming a trench for a second metal wiring; depositing a second metal layer on the trench for the second metal wiring and the second insulating layer; performing a CMP process of the second metal layer, thus forming the second metal wiring in a region intended to be used as a fuse; and depositing a passivation layer on the first metal wiring and the second insulating layer, and etching the passivation layer to a certain thickness by using a third mask pattern.

In this embodiment of the present invention, the first metal layer can be made of aluminium (Al) or copper (Cu), and the second metal layer can be made of Ti or Ti/TiN.

Also, the first metal wiring is only formed in a region intended to be connected with a lower layer by means of a contact, without forming a metal wiring intended to be used as a fuse.

Additionally, the first mask pattern and the second mask pattern are overlapped to a certain width, and the third mask pattern is positioned at a desired interval apart from the second mask pattern in consideration of misalignment of the masks in the masking process.

Also, the etching of the passivation layer is performed so that the first metal wiring is not exposed.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
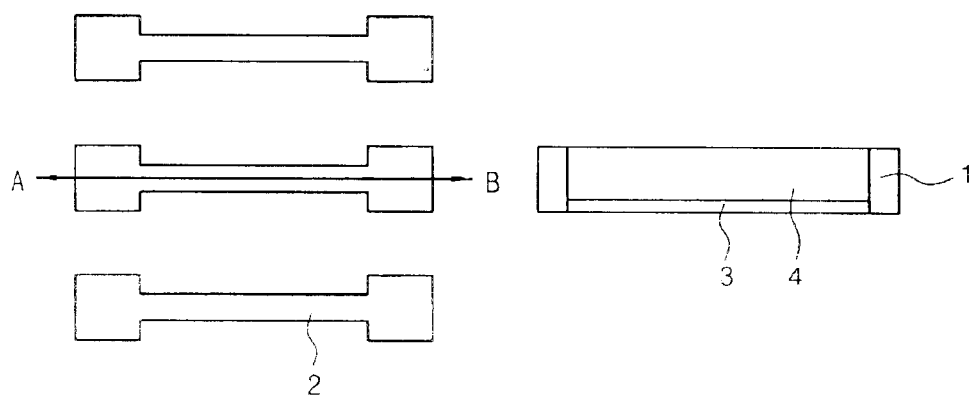
FIGS. 1A and 1B are sectional views showing each step of a conventional method for forming a fuse in a semiconductor device.
Figure 1B:
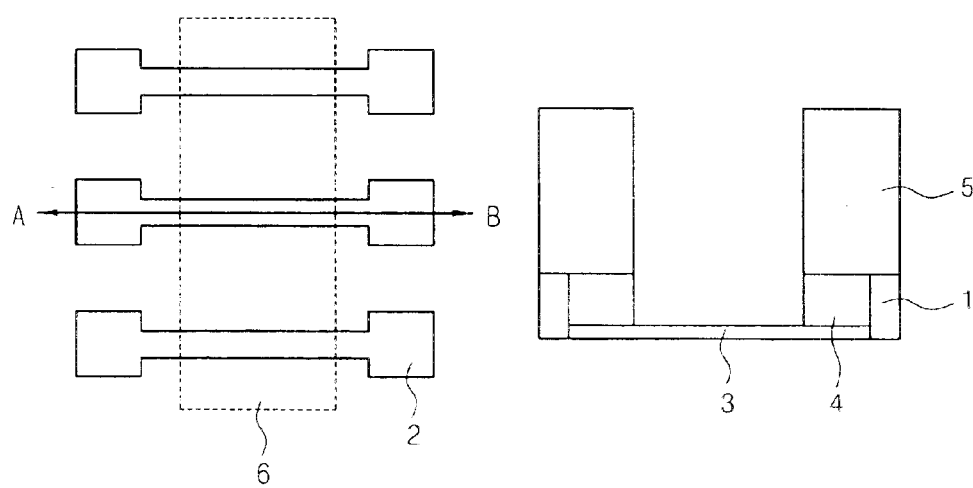

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2A:
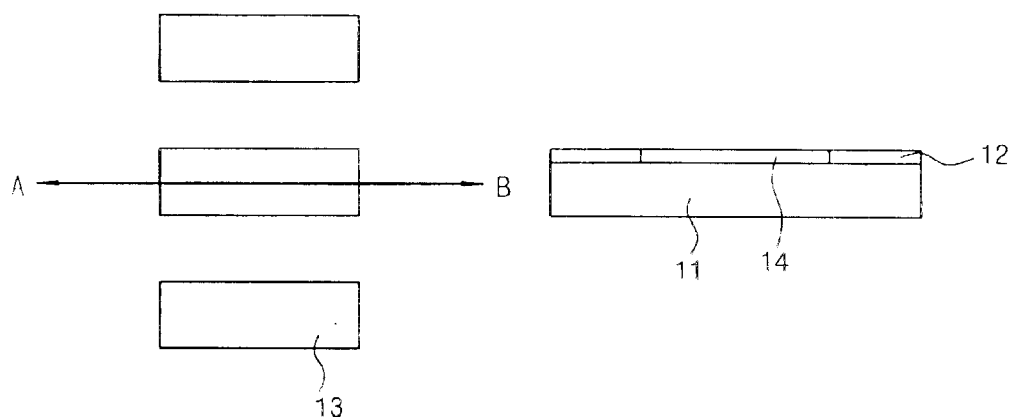
FIGS. 2A to 2C are sectional views showing each step of a method for forming a fuse in a semiconductor device in accordance with one embodiment of the present invention.
Figure 2B:
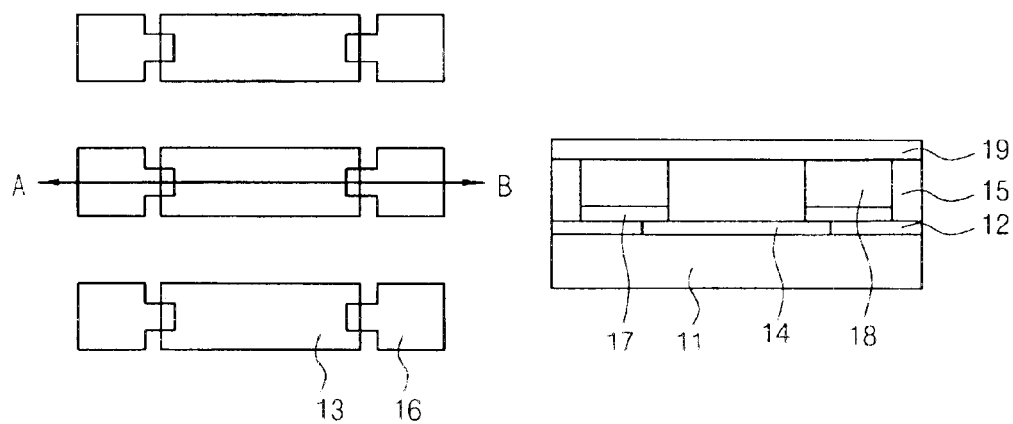
Figure 2C:
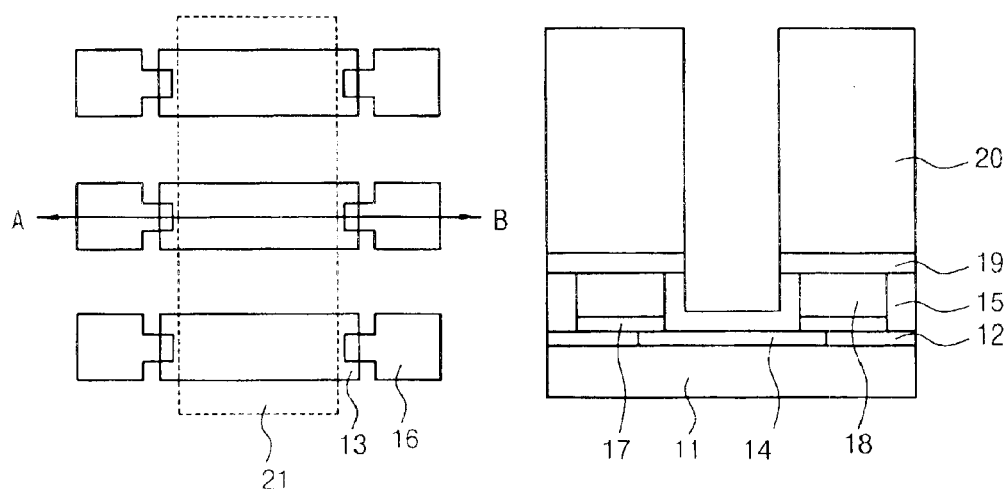

FIGS. 2A to 2C are sectional views showing each step of a method for forming a fuse in a semiconductor device in accordance with one embodiment of the present invention.

Referring to FIG. 2A, the left drawing is a layout 13 for making a first metal wiring 14 in a fuse box, and the right drawing is a sectional view taken along line A–B in the left drawing, showing the first metal wiring 14 in the fuse box, having been formed by using the left drawing as a mask.

Specifically, after forming a second insulating layer 12 on a first insulating layer 11, a trench for metal wiring is formed using a mask drawn as the layout 13 of a first fuse. Then, a metal wiring 14 is formed thickly on the resultant structure to form a first metal wiring in a region intended to be used as a fuse by performing a chemical-mechanical polishing (CMP) process. In this instance, as shown in the left layout drawing of FIG. 2A, metal wiring for the fuse has been formed and the metal wiring has not been formed in the region intended to be connected with a lower part by means of a contact.

Referring to FIG. 2B, the left drawing is a layout 16 for making metal wiring in a region intended to be connected with the lower part in FIG. 2A, and the right drawing is a cross-sectional view taken along line A–B in left drawing for illustrating a second metal wiring of the fuse box formed by using the left drawing as a mask.

Specifically, a third insulating layer 15 is formed on the resultant structure and a trench for a second metal wiring is formed in a region intended to be connected with the lower part by means of a contact, using a mask drawn like the layout 16 of the metal wiring. Then a second metal wiring barrier layer 17 is formed on the resultant structure, and sequentially a second metal wiring 18 is formed thickly thereon, resulting, through performing a CMP process, in production of the metal wiring formed in the region intended to be connected with the lower part by means of a contact.

Next, a buffer layer 19, which is to be used as an etching buffer layer when an etching is performed to open a fuse box, is formed to a certain thickness on the resultant structure. In this instance, the metal wiring intended to be used as a fuse has not been formed, and only the metal wiring in a region intended to be connected with a lower part by means of a contact has been formed.

Referring to FIG. 2C, the left drawing is a layout 21 of a fuse box and the right drawing is a cross-sectional view taken along line A–B in the left drawing and shows a fuse box formed with an opening by using the left drawing as a mask.

Specifically, a passivation layer 20 is formed on the resultant structure, and etching is performed to leave a certain thickness of the passivation layer using a mask drawn like the layout 21 of the fuse box.

In this instance, it is important to expose the first metal wiring 14 intended to be used as a fuse so that it is not completely opened, and to leave the passivation layer on the first metal wiring 14 intended to be used as a fuse so that it is not too thick, because an oxide layer remaining to a certain thickness on the fuse functions as a very important factor at the time of cutting the fuse with a laser. For this reason, a buffer layer has been used as the oxide layer.

Accordingly, when an etching is performed to open the fuse, the etching is first stopped at the buffer layer, the etching of the buffer layer is performed, and then further etching is performed to reach a desired target, thereby accomplishing uniform control of the remaining layers. As explained above, in contrast with the condition of being without a buffer layer, it is possible to control the remaining layers quite rigorously.

Figure 3A:
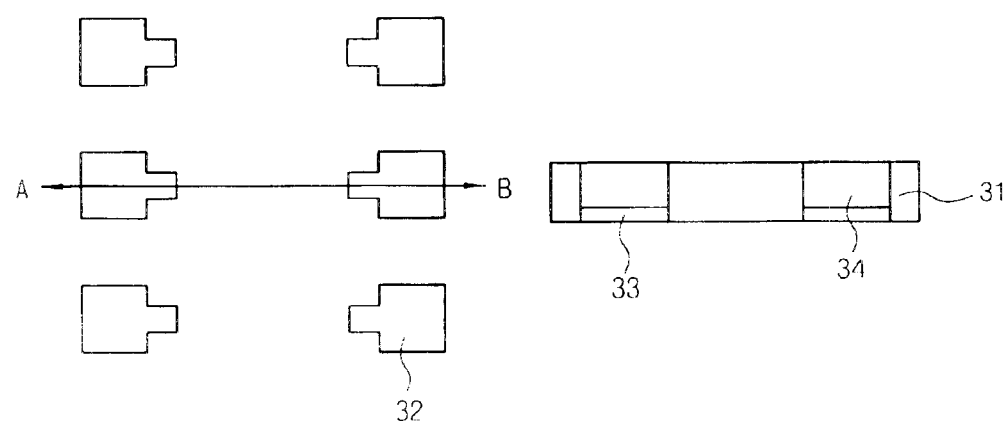
FIGS. 3A to 3c are sectional views showing each step of a method for forming a fuse in a semiconductor device in accordance with another embodiment of the present invention.
Figure 3B:
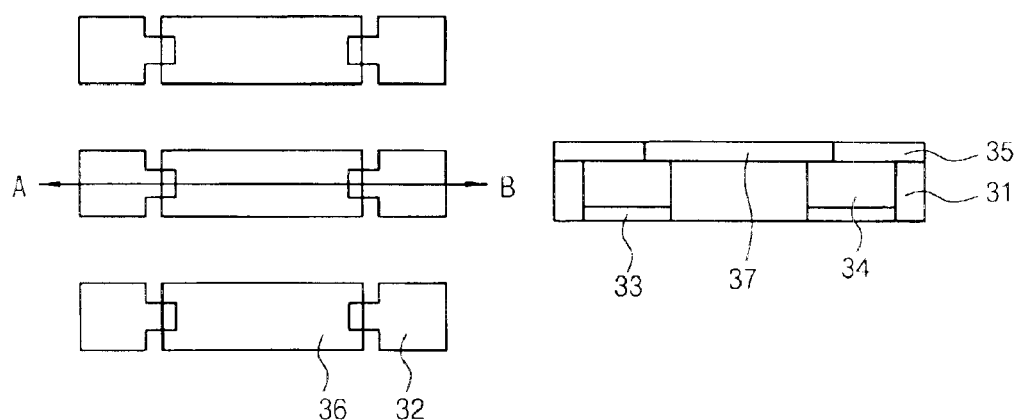
Figure 3C:
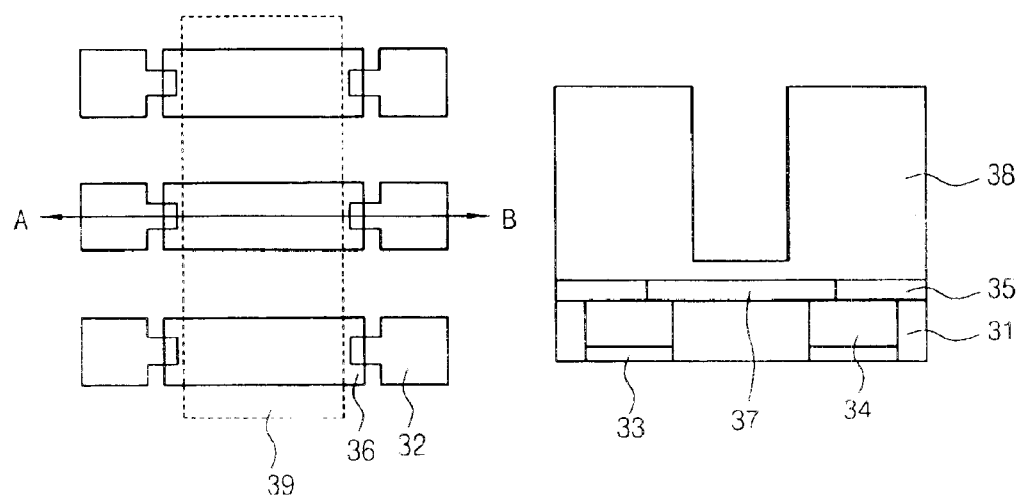

FIGS. 3A to 3c are cross-sectional views for illustrating each step of a method for forming a fuse in a semiconductor device in accordance with another embodiment of the present invention.

Referring to FIG. 3A, the left drawing is a layout 32 for making a first metal wiring 34 in a fuse box, and the right drawing is a cross-sectional view taken along line A–B in the left drawing for showing the first metal wiring 34 in the fuse box formed by using the left drawing as a mask.

Specifically, a first insulating layer 31 is formed on the metal wiring that is formed on the lower part of the device, and then a trench for metal wiring is formed using a mask drawn like the layout 32 of a first fuse. Then, a metal wiring barrier layer 33 is formed on the lower metal wiring, and a metal wiring 34 is formed thickly, resulting, through performing a chemical-mechanical polishing (CMP) process, in the formation of the first metal wiring. In this instance, a metal wiring intended to be used as a fuse has not been formed, and only the metal wiring in a region intended to be connected with a lower part by means of a contact has been formed.

Referring to FIG. 3B, the left drawing is a layout 36 showing metal wiring intended to be used as the fuse shown in FIG. 3A, and the right drawing is a cross-sectional view taken along line A–B in the left drawing to show a second metal wiring in a fuse box formed by using the left drawing as a mask.

Specifically, a second insulating layer 35 is formed on the resultant structure, and then a trench for a second metal wiring is formed by using a mask drawn like the layout 36 of the metal wiring intended to be used as a fuse.

Next, a second metal wiring 37 is formed thickly on the upper part of the trench, resulting, through performing a chemical-mechanical polishing (CMP) process, in the formation of the metal wiring for a fuse in the region intended to be used as a fuse.

Referring to FIG. 3C, the left drawing is a layout 39 of a fuse box shown in FIG. 3B, and the right drawing is a cross-sectional view taken along line A–B in the left drawing for illustrating the fuse box formed with an opening by using the left drawing as a mask.

Specifically, a passivation layer 38 is formed on the resultant structure, and an etching is performed to leave certain thickness of the passivation layer using a mask drawn like the layout 39 of the open fuse box.

In this instance, it is important to expose the second metal wiring 37 intended to be used as a fuse so that it is not completely opened, and to leave the passivation layer 38 on the second metal wiring 37 intended to be used as the fuse so that it is not too thick, because an oxide layer remaining to a certain thickness on the fuse functions as a considerably important factor at the time of cutting the fuse with a laser.

According to the above embodiment of the method for forming a fuse in a semiconductor device of the present invention, a multi-layer metal wiring can be achieved, and in the case of metal wiring using copper, reliability of the semiconductor device can be increased by preventing the corrosion of copper.

As explained above, the method for forming a fuse in a semiconductor device of the present invention can be applied to a multi-layer metal wiring process, and can obviate probabilities of corrosion of metals in a semiconductor device using copper in a damascene process, thereby securing reliability of the semiconductor device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a fuse in a semiconductor device, comprising the steps of:

forming a second insulating layer on a first insulating layer and etching the second insulating layer by using a first mask pattern to form a trench for a first metal wiring;

depositing a first metal wiring layer on the second insulating layer and the trench for the first metal wiring, and performing a chemical-mechanical polishing process on the first metal wiring layer to form the first metal wiring in a region intended to be used as a fuse;

forming a third insulating layer on the first metal wiring and the second insulating layer, and etching the third insulating layer by using a second mask pattern to form a trench for a second metal wiring in a region intended to be connected to a lower layer by means of a contact;

sequentially depositing a barrier layer and a second metal wiring layer on the third insulating layer and the trench for the second metal wiring, and performing a CMP process on the barrier layer and the third insulating layer to form the second metal wiring in a region intended to be connected to a lower layer by means of a contact;

depositing a buffer layer on the second metal wiring and the third insulating layer, the buffer layer being intended to act as an etch buffer layer at the time of an etching in order to open a fuse box; and forming a passivation layer on the buffer layer, and etching the passivation layer to a desired thickness by using a third mask pattern, the etching of the passivation layer being performed so that the first metal wiring is not exposed.

2. The method for forming a fuse according to claim 1, wherein the first metal layer is made of Ti or Ti/TiN.

3. The method for forming a fuse according to claim 1, wherein the second metal layer is made of aluminum (Al) or copper (Cu).

4. The method for forming a fuse according to claim 1, wherein the first metal wiring is formed only in a region intended to be used as a fuse.

5. The method for forming a fuse according to claim 1, wherein the second metal wiring is formed only in a region intended to be connected to the lower layer by means of the contact, without forming a metal wiring intended to be used as a fuse.

6. The method for forming a fuse according to claim 1, wherein the first mask pattern and the second mask pattern are overlapped to a certain width.

7. The method for forming a fuse according to claim 1, wherein the third mask pattern is positioned at a desired interval apart from the second mask pattern, in consideration of misalignment of the masks in the masking process.

8. The method for forming a fuse according to claim 1, wherein the buffer layer is made of nitride.

* * * * *